United States Patent
Su

(10) Patent No.: US 6,587,063 B1
(45) Date of Patent: Jul. 1, 2003

(54) FOUR-ORDER SIGMA-DELTA MODULATOR

(75) Inventor: Tsung-Yi Su, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/167,360

(22) Filed: Jun. 11, 2002

(30) Foreign Application Priority Data

Feb. 19, 2002 (TW) ........................................ 91102781 A

(51) Int. Cl.[7] .................................................. H03M 3/00
(52) U.S. Cl. ........................ 341/143; 341/144; 341/155
(58) Field of Search .............................. 341/143, 144, 341/155, 77, 172, 150, 156, 145

(56) References Cited

U.S. PATENT DOCUMENTS

| | | | | |
|---|---|---|---|---|
| 5,623,263 A | * | 4/1997 | Kuo et al. ................... | 341/143 |
| 5,673,044 A | * | 9/1997 | Pellon ......................... | 341/143 |
| 5,682,160 A | * | 10/1997 | Ribner et al. ............... | 341/143 |
| 5,859,603 A | * | 1/1999 | Noguchi et al. ............. | 341/77 |
| 6,057,793 A | * | 5/2000 | Gong et al. ................. | 341/143 |

* cited by examiner

Primary Examiner—Brian Young
Assistant Examiner—John Nguyen
(74) Attorney, Agent, or Firm—Fish & Richardson, P.C.

(57) ABSTRACT

A four-order sigma-delta modulator. The modulator implements a feedback and a feedforward configuration, so that the desired noise transfer function is carried out by adjusting the coefficients of the feedback and the feedforward. The four-order sigma-delta modulator includes: an analog-to-digital converter, a digital-to-analog converter, a first integrating network, a second integrating network, a third integrating network, a fourth integrating network, and an adder.

12 Claims, 3 Drawing Sheets

FOUR-ORDER SIGMA-DELTA MODULATOR

Pursuant to 35 U.S.C. § 119(a)-(d), this application claims priority from Taiwanese application no. 91102781, filed on Feb. 19, 2002.

BACKGROUND OF THE INVENTION

1. Field of the Invention:

The invention relates to an four-order sigma-delta modulator, which implements a feedback and a feedforward configuration, so that the desired noise transfer function is carried out by adjusting the coefficients of the feedback and the feedforward.

2. Description of the Related Art:

With proper design, the sigma-delta modulator can have the advantages of high resolution, simple circuit, no additional trimming circuit and high tolerance for device replacement. As is well-known in sigma-delta modulators, SNR is dependent on the oversampling ratio, the sigma-delta modulator order and quantizer resolution. Theoretically, doubling the oversampling ratio should result in a 3 dB improvement in SNR, and increasing the order of the sigma-delta modulator by one should produce another 6 dB improvement in SNR within the desired bandwidth. A 1-bit (two value) increase in quantizer resolution should yield another 6 dB. Therefore, such a sigma-delta modulator is widely applied in situations requiring higher SNR. As well, digital communication has been growing rapidly during the past few years. For development of digital communication, a three order or more sigma-delta modulator has become a popular design area.

As shown in FIG. 1, a typical high-order sigma-delta modulator feeds back the digital signal Y from an A/D quantizer 108 to the input terminals respectively to the integrators 102, 104 and 106 through a D/A converter 110, so as to form a desired three-order or more noise transfer function. Such a structure can have different noise transfer functions by adjusting the integrator's output coefficients. However, the feedback configuration in the sigma-delta modulator will cause overload and introduce a complicated circuit when implementing the desired noise transfer function, even though it can have higher resolution and higher SNR with higher orders.

SUMMARY OF THE INVENTION

Accordingly, an object of the invention is to provide a four-order sigma-delta modulator, which implements a feedback and a feedforward configuration, so that the desired noise transfer function is carried out by adjusting the coefficients of the feedback and the feedforward.

To realize the above object, the invention provides a four-order sigma-delta modulator comprising: an analog-to-digital converter, to output a digital modulation signal; a digital-to-analog converter, to convert the digital modulation signal into an analog signal and generate a feedback signal; a first integrating network, to receive an external input signal and the feedback signal and generate a first output signal; a second integrating network, connected in series with the first integrating network, to receive the first output signal and a feedback gain signal with a first feedback gain factor, generated by gaining the feedback signal by the first feedback gain factor, and generate a second output signal; a third integrating network, connected in series with the second integrating network, to receive the second output signal and generate a third output signal; a fourth integrating network, connected in series with the third integrating network, to receive the third output signal and a feedback gain signal with a second feedback gain factor, generated by gaining the feedback signal by the second feedback gain factor, and generate a fourth output signal; and an adder, combining a feedforward output signal with a feedforward gain factor, generated by gaining the second output signal by the feedforward gain factor, and a modulation output signal with a modulation gain factor, generated by gaining the fourth output signal by the modulation gain factor, to generate a desired noise transfer function, and outputting a noise transfer signal to the digital-to-analog converter.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
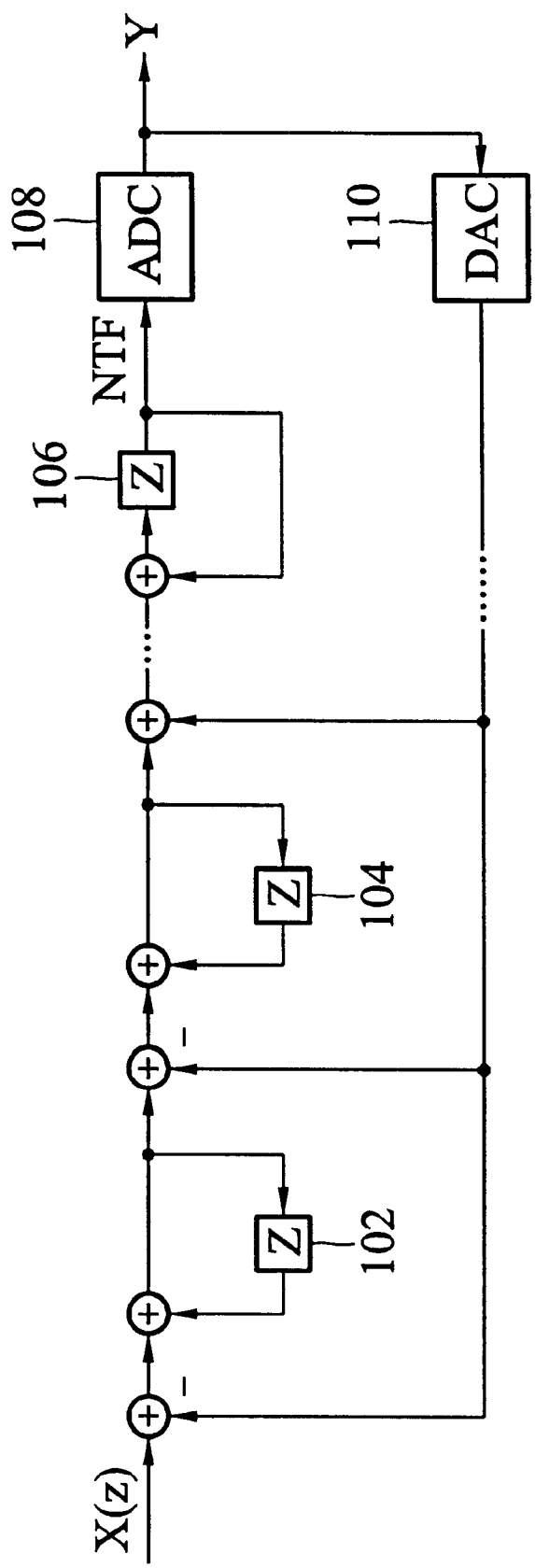
FIG. 1 is a typical high-order sigma-delta modulator.
Figure 2:
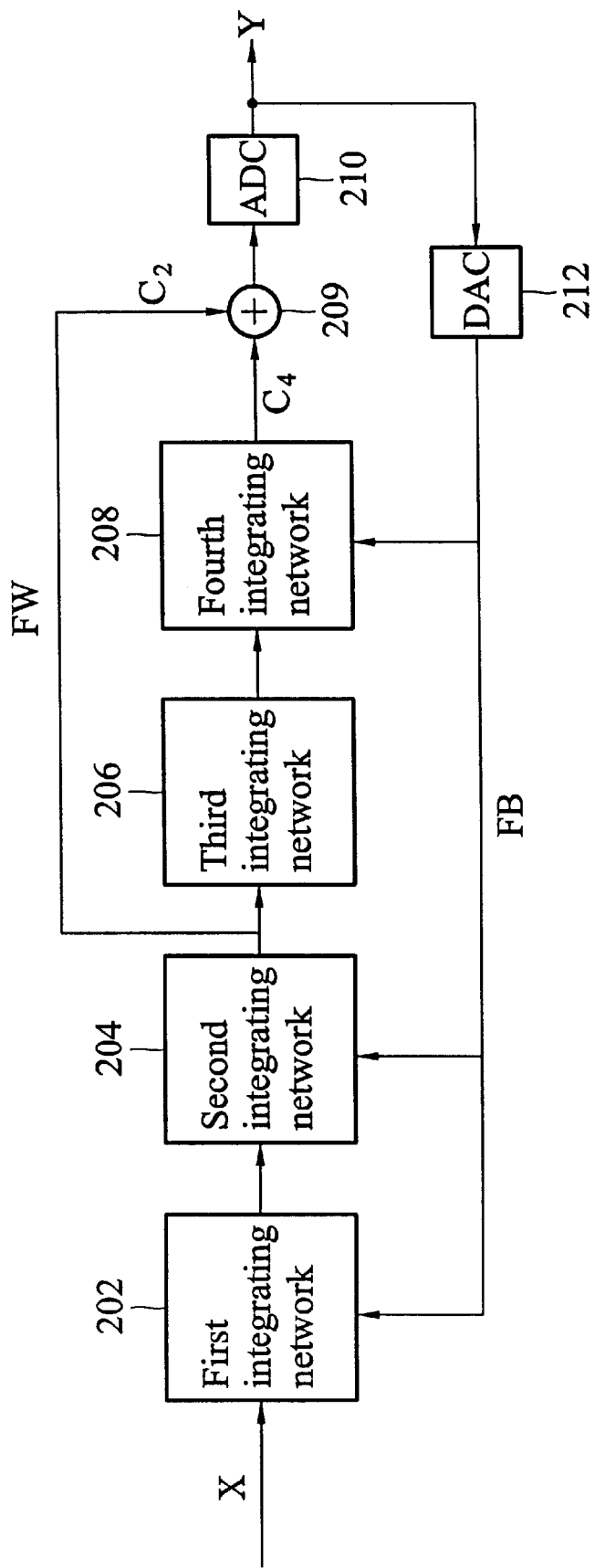
FIG. 2 is a schematic diagram illustrating a four-order sigma-delta modulator of the invention.

FIG. 2 is a schematic diagram illustrating a four-order sigma-delta modulator of the invention. The four-order sigma-delta modulator, as shown in FIG. 2, comprises a first integrating network 202, a second integrating network 204, a third integrating network 206, a fourth integrating network 208, an adder 209, an analog-to-digital converter 210 and a digital-to-analog converter 212.

The first integrating network 202 receives an external input signal X and generates a first output signal. The first output signal is input to the second integrating network 204, which is connected in series with the first integrating network 202. The second integrating network 204 generates a second output signal. Concurrently, the second output signal is input to the adder 209 through a feedforward path FW including a feedforward gain factor $C_2$. The third integrating network 206 is connected in series with the second integrating network 204. The third integrating network 206 receives the second output signal and generates a third output signal. The fourth integrating network 208 follows the third integrating network 206 to receive the third output signal and generate a fourth output signal. The fourth output signal is input to the adder 209 through the amplification of a modulation gain factor $C_4$. The adder 209 combines a feedforward output signal with the feedforward gain factor $C_2$, generated by gaining the second output signal by the feedforward gain factor, and a modulation output signal with the modulation gain factor $C_4$, generated by gaining the fourth output signal by the modulation gain factor to generate a desired noise transfer function. At this point, the external input signal X becomes a noise transfer signal (not shown). The noise transfer signal is converted into a digital signal Y by an analog-to-digital converter 210 following the adder 209. The digital signal Y is converted into an analog feedback signal by a digital-to-analog converter 210. The analog feedback signal is fed back to the first integrating network 202 and the second integrating network 204 through a feedback path FB. As such, a desired noise transfer function can be implemented by adjusting the feedforward gain factor $C_2$ and the modulation gain factor $C_4$. An embodiment is further described in the following.

Figure 3:
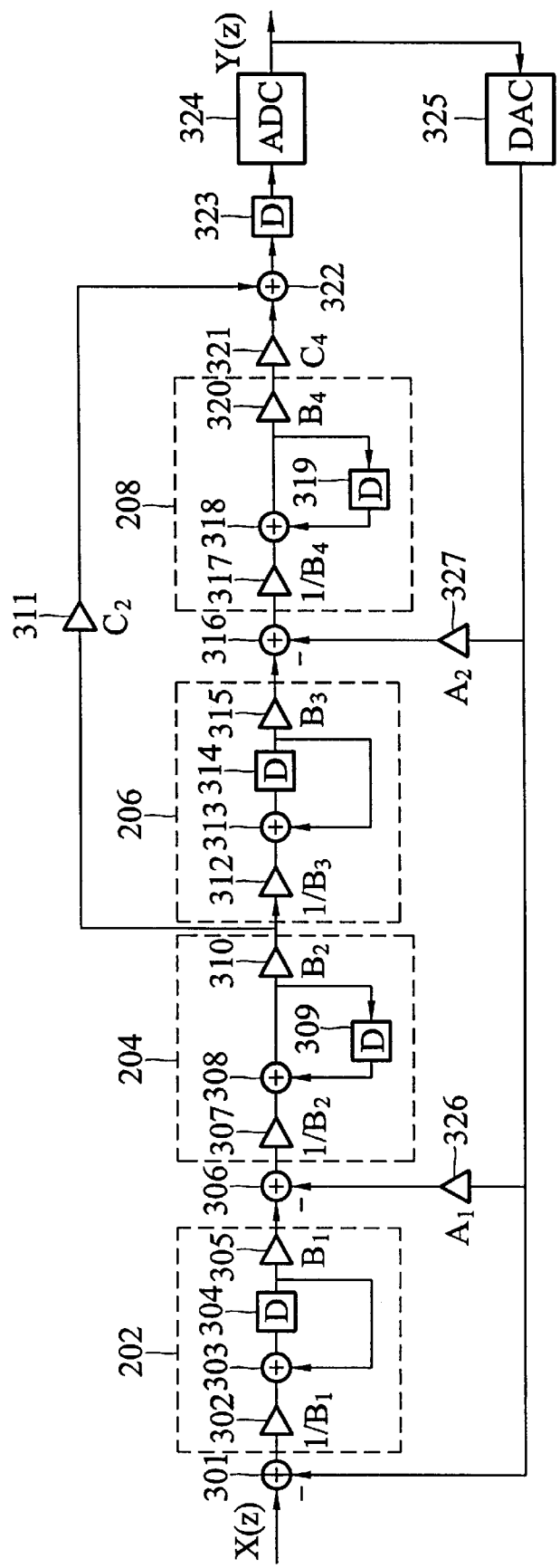
FIG. 3 is an embodiment of FIG. 2 according to the invention.

FIG. 3 is an embodiment of FIG. 2 according to the invention. The four-order sigma-delta modulator, as shown in the FIG. 2, comprises a first adder 301, a first gain unit 302, a second adder 303, a first delay unit 304, a second gain unit 305, a third adder 306, a third gain unit 307, a fourth adder 308, a second delay unit 309, a fourth gain unit 310, a feedforward gain unit 311, a fifth gain unit 312, a fifth adder 313, a third delay unit 314, a sixth gain unit 315, a sixth adder 316, a seventh gain unit 317, a seventh adder 318, a fourth delay unit 319, an eighth gain unit 320, a modulation gain unit 321, an eighth adder 322, a fifth delay unit 323, an N-bit analog-to-digital converter 324, an N-bit digital-to-analog converter 325, a first feedback gain unit 326 and a second feedback gain unit 327. The first gain unit 302, second adder 303, first delay unit 304 and second gain unit 305 comprise the first integrating network 202 shown in FIG. 2. The third gain unit 307, fourth adder 308, second delay unit 309 and fourth gain unit 310 comprise the second integrating network 204 shown in FIG. 2. The fifth gain unit 312, fifth adder 313, third delay unit 314 and sixth gain unit 315 comprise the third integrating network 206 shown in FIG. 2. The seventh gain unit 317, seventh adder 318, fourth delay unit 319 and eighth gain unit 320 comprise the fourth integrating network 208 shown in FIG. 2. Moreover, the first gain unit 302 has a first gain factor $B_1$. The second gain unit 305 has a second gain factor $1/B_1$. The first gain factor $B_1$ and the second gain factor $1/B_1$ are reciprocal. The third gain unit 307 has a third gain factor $B_2$. The fourth gain unit 310 has a fourth gain factor $1/B_2$. The third gain factor $B_2$ and the fourth gain factor $1/B_2$ are reciprocal. The fifth gain unit 312 has a fifth gain factor $B_3$. The sixth gain unit 315 has a sixth gain factor $1/B_3$. The fifth gain factor $B_3$ and the sixth gain factor $1/B_3$ are reciprocal. The seventh gain unit 317 has a seventh gain factor $B_4$. The eighth gain unit 320 has an eighth gain factor $1/B_4$. The seventh gain factor $B_4$ and the eighth gain factor $1/B_4$ are reciprocal.

As shown in FIG. 3, the first adder 301 outputs a difference between a feedback signal from the N-bit digital-to-analog converter 325 and an input external signal X to the first gain unit 302. The first gain unit 302 amplifies the difference by the first gain factor $1/B_1$ and outputs the result to the second adder 303. The second adder 303 adds the signal with the first gain factor $1/B_1$ and a feedback signal generated by passing the signal with the first gain factor $1/B_1$ through the first delay unit 304 for delaying a clock. The addition signal is input again to the first delay unit 304. The output of the first delay unit 304 is input to the second gain unit 305. The second gain unit 305 amplifies the output of the first delay unit 304 by the second gain factor $B_1$ and outputs the result to generate the first output signal as shown in FIG. 2.

The first output signal is input to the third adder 306. The third adder 306 outputs a difference between the first output signal and an output signal from the first feedback gain unit 326 to the third gain unit 307. The first feedback gain unit 326 has a feedback gain factor $A_1$. The third gain unit 307 amplifies the difference by the third gain factor $1/B_2$ and outputs the result to the fourth adder 308. The fourth adder 308 adds the signal with the third gain factor $1/B_2$ and a feedback signal generated by passing the signal with the third gain factor $1/B_2$ through the second delay unit 309 for delaying a clock. The addition signal is input to the fourth gain unit 310. The fourth gain unit 310 amplifies an addition signal by the fourth gain factor $B_2$ and outputs the result to generate the second output signal as shown in FIG. 2.

The second output signal is input to the fifth gain unit 312 and passes through a feedforward path FW including the feedforward gain unit 311 to generate a feedforward output signal with the feedforward gain factor $C_2$. The feedforward output signal is input to the eighth adder 322. The fifth gain unit 312 amplifies the second output signal by the fifth gain factor $1/B_3$ and outputs the result to the fifth adder 313. The fifth adder 313 adds the signal with the fifth gain factor $1/B_3$ and a feedback signal generated by passing the signal with the fifth gain factor $1/B_3$ through the third delay unit 314 for delaying a clock. The addition signal is input again to the third delay unit 314. The output of the third delay unit 314 is input to the sixth gain unit 315. The sixth gain unit 315 amplifies an addition signal by the sixth gain factor $B_3$ and outputs the result to generate the third output signal as shown in FIG. 2.

The third output signal is input to the sixth adder 316. The sixth adder 316 outputs a difference between the second output signal and an output signal from the second feedback gain unit 327 to the seventh gain unit 317. The second feedback gain unit 327 has a feedback gain factor $A_2$. The seventh gain unit 317 amplifies the difference by the seventh gain factor $1/B_4$ and outputs the result to the seventh adder 318. The seventh adder 318 adds the signal with the seventh gain factor $1/B_4$ and a feedback signal generated by passing the signal with the seventh gain factor $1/B_4$ through the fourth delay unit 319 for delaying a clock. The addition signal is input to the eighth gain unit 320. The eighth gain unit 320 amplifies an addition signal by the eighth gain factor $B_4$ and outputs the result to generate the fourth output signal as shown in FIG. 2.

The fourth output signal is input to the modulation gain unit 321 to generate a four-order sigma-delta output signal with a modulation gain factor $C_4$. The eighth adder 322 combines the feedforward signal with the feedforward gain factor $C_2$ and the four-order sigma-delta output signal with the modulation gain factor $C_4$. The addition result is input to the fifth delay unit 323 for delaying a clock to generate a noise transfer function NTF.

The noise transfer function NTF is input to the N-bit analog-to-digital converter 324 to generate a digital modulation signal Y for output to the external and feeding back to the N-bit digital-to-analog converter 325 to further generate the feedback signal and the feedforward signal. As such, the desired noise transfer function NTF can be expressed by the following equation:

$$NTF = \frac{(Z-1)^4}{\begin{array}{c} Z^4 + Z^3(-4 + A_1 C_2 + A_2 C_4) + \\ Z^2(-6 + C_2 - 3A_1 C_2 + A_1 C_4 - 3A_2 C_4) + \\ Z(-4 - 2C_2 + 3A_1 C_2 + C_4 - A_1 C_4 + 3A_2 C_4) + \\ (1 + C_2 - A_1 C_4 - A_1 C_4) \end{array}}$$

where NTF is the desired noise transfer function; Z is the Z transform variable; $A_1$, $A_2$ are the first, second feedback gain factors; $C_2$ is the feedforward gain factor; and $C_4$ is the modulation gain factor. Therefore, a four-order sigma-delta modulator with the desired noise transfer function is obtained by adjusting the factors $A_1$, $A_2$, $C_2$ and $C_4$.

Appendix A is a simulated spectrum of a four-order 3-bit modulator with sine wave of which the intensity is 2 db input.

In practice, any switched capacitor can be used to implement an analog four-order sigma-delta modulator with the above noise transfer function or any digital logic circuit can be used to implement a digital four-order sigma-delta modulator with the above noise transfer function. For example, every delay unit of FIG. 3 can be implemented by a switched capacitor or a flip/flop to generate a clock delay.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A four-order sigma-delta modulator, comprising:
an analog-to-digital converter, to output a digital signal;
a digital-to-analog converter, to convert the digital signal into an analog signal and generate a feedback signal;
a first integrating network, to receive an external input signal and the feedback signal and generate a first output signal;
a second integrating network, connected in series with the first integrating network, to receive the first output signal and a feedback gain signal with a first feedback gain factor, generated by gaining the feedback signal by the first feedback gain factor, and generate a second output signal;
a third integrating network, connected in series with the second integrating network, to receive the second output signal and generate a third output signal;
a fourth integrating network, connected in series with the third integrating network, to receive the third output signal and a feedback gain signal with a second feedback gain factor, generated by gaining the feedback signal by the second feedback gain factor, and generate a fourth output signal; and
an adder, combining a feedforward output signal with a feedforward gain factor, generated by gaining the second output signal by the feedforward gain factor, and a modulation output signal with a modulation gain factor, generated by gaining the fourth output signal by the modulation gain factor, to generate a desired noise transfer function, and outputting a noise transfer signal to the digital-to-analog converter.

2. The four-order sigma-delta modulator of claim 1, wherein the feedforward, first feedback, second feedback and modulation gain factors has a relationship with the desired noise transfer function as the following equation:

$$NTF = \frac{(Z-1)^4}{\begin{array}{c}Z^4 + Z^3(-4 + A_1C_2 + A_2C_4) + \\ Z^2(-6 + C_2 - 3A_1C_2 + A_1C_4 - 3A_2C_4) + \\ Z(-4 - 2C_2 + 3A_1C_2 + C_4 - A_1C_4 + 3A_2C_4) + \\ (1 + C_2 - A_1C_4 - A_1C_4)\end{array}}$$

where NTF is the desired noise transfer function; Z is a Z transform variable; $A_1, A_2$ are the first, second feedback gain factors; $C_2$ is the feedforward gain factor; and $C_4$ is the modulation gain factor.

3. The four-order sigma-delta modulator of claim 2, wherein any analog four-order sigma-delta modulator with the desired noise transfer function comprises a switched capacitor.

4. The four-order sigma-delta modulator of claim 2, wherein any digital four-order sigma-delta modulator with the desired noise transfer function comprises a digital logic circuit.

5. A four-order sigma-delta modulator, comprising:
a first adder, having a first input terminal, a second input terminal and an output terminal, the first input terminal connected to an external input signal;
a first gain unit, having an input terminal and an output terminal, the input terminal connected to the output terminal of the first adder;
a second adder, having a first input terminal, a second input terminal and an output terminal, the first input terminal connected to the output terminal of the first gain unit;
a first delay unit, having an input terminal and an output terminal, the input terminal connected to the output terminal of the second adder, the output terminal connected to the second input terminal of the second adder;
a second gain unit, having an input terminal and an output terminal, the input terminal connected to the output terminal of the first delay unit;
a third adder, having a first input terminal, a second input terminal and an output terminal, the first input terminal connected to the output terminal of the second gain unit;
a third gain unit, having an input terminal and an output terminal, the input terminal connected to the output terminal of the third adder;
a fourth adder, having a first input terminal, a second input terminal and an output terminal, the first input terminal connected to the output terminal of the third gain unit;
a second delay unit, having an input terminal and an output terminal, the input terminal connected to the output terminal of the fourth adder, the output terminal connected to the second input terminal of the fourth adder;
a fourth gain unit, having an input terminal and an output terminal, the input terminal connected to the output terminal of the fourth adder;
a feedforward gain unit, having an input terminal and an output terminal, the input terminal connected to the output terminal of the fourth gain unit;
a fifth gain unit, having an input terminal and an output terminal, the input terminal connected to the output terminal of the fourth gain unit;
a fifth adder, having a first input terminal, a second input terminal and an output terminal, the first input terminal connected to the output terminal of the fifth gain unit;
a third delay unit, having an input terminal and an output terminal, the input terminal connected to the output terminal of the fifth adder, the output terminal connected to the second input terminal of the fifth adder;
a sixth gain unit, having an input terminal and an output terminal, the input terminal connected to the output terminal of the third delay unit;
a sixth adder, having a first input terminal, a second input terminal and an output terminal, the first input terminal connected to the output terminal of the sixth gain unit;
a seventh gain unit, having an input terminal and an output terminal, the input terminal connected to the output terminal of the sixth adder;
a seventh adder, having a first input terminal, a second input terminal and an output terminal, the first input terminal connected to the output terminal of the seventh gain unit;
a fourth delay unit, having an input terminal and an output terminal, the input terminal connected to the output terminal of the seventh adder, the output terminal connected to the second input terminal of the seventh adder;

an eighth gain unit, having an input terminal and an output terminal, the input terminal connected to the output terminal of the seventh adder;

a modulation gain unit, having an input terminal and an output terminal, the input terminal connected to the output terminal of the eighth gain unit;

an eighth adder, having a first input terminal, a second input terminal and a output terminal, the first input terminal connected to the output terminal of the modulation gain unit, the second input terminal connected to the output terminal of the feedforward gain unit;

a fifth delay unit, having an input terminal and an output terminal, the input terminal connected to the output terminal of the eighth adder;

an N-bit analog-to-digital converter, having an input terminal and an output terminal, the input terminal connected to the output terminal of the fifth delay unit, the output terminal connected to the external;

an N-bit digital-to-analog converter, having an input terminal and an output terminal, the input terminal connected to the output terminal of the N-bit analog-to-digital converter, the output terminal connected to the second input terminal of the first adder;

a first feedback gain unit, having an input terminal and an output terminal, the input terminal connected to the output terminal of the N-bit digital-to-analog converter, the output terminal connected to the second input terminal of the third adder; and a second feedback gain unit, having an input terminal and an output terminal, the input terminal connected to the output terminal of the N-bit digital-to-analog converter, the output terminal connected to the second input terminal of the sixth adder.

6. The four-order sigma-delta modulator of claim 5, wherein N is any integer greater than zero.

7. The four-order sigma-delta modulator of claim 5, wherein the first, second, third, fourth, fifth, sixth, seventh and eighth gain units has a first, second, third, fourth, fifth, sixth, seventh and eighth gain factors respectively.

8. The four-order sigma-delta modulator of claim 7, wherein the first and second gain factors are reciprocal; the third and fourth gain factors are reciprocal; the fifth and sixth gain factors are reciprocal; and the seventh and eighth gain factors are reciprocal.

9. The four-order sigma-delta modulator of claim 5, wherein the feedforward, first feedback, second feedback and modulation gain units has a feedforward, first feedback, second feedback and modulation gain factors, respectively.

10. The four-order sigma-delta modulator of claim 9, wherein the feedforward, first feedback, second feedback and modulation gain factors has a relationship with the desired noise transfer function as the following equation:

$$NTF = \frac{(Z-1)^4}{\begin{array}{c}Z^4 + Z^3(-4 + A_1C_2 + A_2C_4) + \\ Z^2(-6 + C_2 - 3A_1C_2 + A_1C_4 - 3A_2C_4) + \\ Z(-4 - 2C_2 + 3A_1C_2 + C_4 - A_1C_4 + 3A_2C_4) + \\ (1 + C_2 - A_1C_4 - A_1C_4)\end{array}}$$

where NTF is the desired noise transfer function; Z is a Z transform variable; $A_1, A_2$ are the first, second feedback gain factors; $C_2$ is the feedforward gain factor; and $C_4$ is the modulation gain factor.

11. The four-order sigma-delta modulator of claim 10, wherein any analog four-order sigma-delta modulator with the desired noise transfer function comprises a switched capacitor.

12. The four-order sigma-delta modulator of claim 10, wherein any digital four-order sigma-delta modulator with the desired noise transfer function comprises a digital logic circuit.

\* \* \* \* \*